United States Patent [19]
Shiotsuka

[11] Patent Number: 5,781,059
[45] Date of Patent: Jul. 14, 1998

[54] DRIVER CIRCUIT FOR SEMICONDUCTOR TEST SYSTEM

[75] Inventor: Hiroyuki Shiotsuka, Tokyo, Japan

[73] Assignee: Advantest Corp., Tokyo, Japan

[21] Appl. No.: 716,996

[22] Filed: Sep. 20, 1996

[30] Foreign Application Priority Data

Sep. 22, 1995 [JP] Japan ................................ 7-269394

[51] Int. Cl.$^6$ .................................................. H03K 17/62
[52] U.S. Cl. ........................ 327/407; 327/109; 327/382; 327/494; 327/496; 327/587; 327/588
[58] Field of Search .................... 327/99, 108, 109, 327/382, 403, 407, 423, 493, 494, 495, 496, 503, 504, 505, 583, 587, 588

[56] References Cited

U.S. PATENT DOCUMENTS

| | | | |
|---|---|---|---|
| 5,036,219 | 7/1991 | Dingwall et al. | 327/494 |
| 5,276,355 | 1/1994 | Nagata | 327/494 |

Primary Examiner—Timothy P. Callahan
Assistant Examiner—Jeffrey Zweizig
Attorney, Agent, or Firm—Muramatsu & Associates

[57] ABSTRACT

A driver circuit for a semiconductor test system generates test signals having predetermined voltage levels without being affected by stray capacitances. The driver circuit includes: a buffer amplifier for supplying test signals having predetermined voltage levels; a first diode bridge connected to a first voltage source for providing a first voltage level to the buffer amplifier where the first diode bridge has an upper node and an lower; a second diode bridge connected to a second voltage source for providing a second voltage level to the buffer amplifier where the second diode bridge has an upper node and an lower node; a third diode bridge connected to a third voltage source for providing a third voltage level to the buffer amplifier where the third diode bridge has an upper node and an lower node; a fourth diode bridge connected between the first voltage source and the lower node of the third diode bridge; and a fifth diode bridge connected between the second voltage source and the upper node of the third diode bridge.

11 Claims, 7 Drawing Sheets

DRIVER CIRCUIT FOR SEMICONDUCTOR TEST SYSTEM

FIELD OF THE INVENTION

This invention relates to a driver circuit for a semiconductor test system for testing semiconductor devices, and more particularly, to a driver circuit for a semiconductor test system which generates test signals having three voltage levels with improved timing and voltage level accuracy.

BACKGROUND OF THE INVENTION

In testing a semiconductor device by a semiconductor test system such as an IC tester, test signals are supplied to each pin of the semiconductor device and the resulted output of the semiconductor device under test is compared with expected data to determine whether the semiconductor device functions correctly or not. Such driver circuits are provided in the semiconductor test system for each test channel, i.e., for each test circuit corresponding to each device pin.

Each test signal is supplied to the corresponding device pin through a driver circuit. A driver circuit produces desired voltage levels and slew rates of the test signal to be applied to a pin of the device under test. As a result of the test signals, the device under test generates output signals which are tested by the semiconductor test system. The output signals are compared with the expected signals generated by the semiconductor test system by logic comparators, and if a fail is detected, such information is stored in a fail memory for further analysis.

Basically, driver circuits are designed to output test signals with two predetermined voltage levels, for example, high and low levels. However, many recent semiconductor devices function in a time sequence manner in which a certain pin of the device can be an input pin for a certain time slot as well as an output pin for other time slot. For testing such a semiconductor device whose pin can be both input and output pin, a driver circuit for this pin must be able to provide the test signal with high and low voltage levels when the device pin is an input pin. The driver circuit must also be able to provide a termination voltage to the same device pin when the output signal of the pin is to be tested.

Further, for testing various kinds of semiconductor devices whose pin characters are not assigned in the same way, driver circuits must be able to perform whether the device pin is an input or output pin. For example, a certain pin is an input terminal for a certain device while the same pin in the other device is an output terminal. Therefore, a semiconductor test system must have a driver circuit for each device pin which can provide a test signal with high or low voltage level for one type of device as well as a termination voltage for another type of device.

Therefore, such a drive circuit has three output voltages, a logic high voltage V1, a logic low voltage V2 and a termination voltage V3. For example, when testing a ECL integrated circuit such as a micro processor, a driver circuit has to generated a logic high level V1=−0.8V, a logic low level V2=−1.6V and a termination voltage V3=2.0V. Such voltage levels are varied depending on the kinds of semiconductor devices to be tested.

Moreover, the termination voltage V3 is not necessary be smaller than the voltages V1 or V2. The termination voltage V3 can be higher voltage than the high and low voltages V1 or V2. Therefore, each of the voltages sources V1, V2 and V3 in the driver circuit for the semiconductor test system is variable to meet the requirements for the kinds of the devices to be tested.

2

Figure 4:
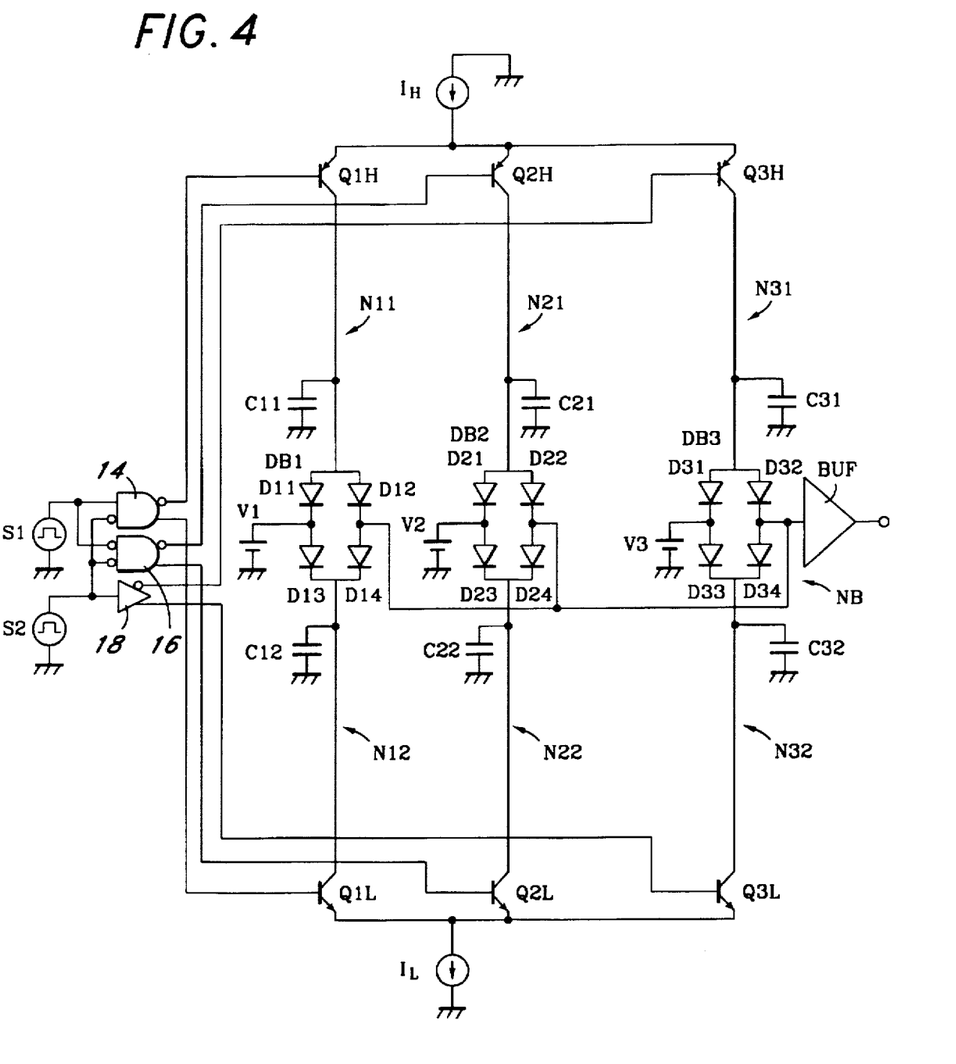
FIG. 4 is a circuit diagram showing a basic structure of a driver circuit known and previously used by the assignee of the present invention for generating test signals of three-voltage levels.

An example of three level voltage driver circuit which is known to the same assignee of the present invention is shown in FIG. 4. The driver circuit of FIG. 4 is a basic driver circuit which can output test signals with three voltage levels V1–V3 by having three diode bridges. For example, two voltage levels V1 and V2 are a logic high level and a logic low level, respectively. The third voltage level V3 is for terminating an output of the device through an output impedance (not shown) such as 50 ohm.

In FIG. 4, a diode bridge DB1 is connected between a transistor Q1H and a transistor Q1L. The diode bridge DB1 is provided with a high level voltage V1. A diode bridge DB2 is connected between a transistor Q2H and a transistor Q2L. The diode bridge DB2 is provided with a low level voltage V2. A diode bridge DB3 is connected between a transistor Q3H and a transistor Q3L. The diode bridge DB3 is provided with a terminal voltage V3. Each output of the diode bridges DB1, DB2 ad DB3 is connected to an input terminal or a node NB of a buffer amplifier BUF. The diode bridge DB1 is formed of four diodes $D_{11}$–$D_{14}$, the diode bridge DB2 is formed of four diodes $D_{21}$–$D_{24}$, and the diode bridge DB3 is formed of four diodes $D_{31}$–$D_{34}$.

A current source $I_H$ is connected to the upper side transistors Q1H–Q3H and a current source $I_L$ is connected to lower side the transistors Q1L–Q3L as shown in FIG. 4. Gates 14 and 16 and an inverter 18 are provided to drive the corresponding transistors and thus the diode bridges. Control signals S1 and S2, which are basically test pattern signals generated by a semiconductor test system, are provided to the gates 14, 16 and the inverter 18 to select either one of the voltages V1–V3 by driving the corresponding pair of transistors and the diode bridge.

FIG. 4 also shows stray capacitances C11–C32 which are inherent capacitances exist between physical distances of the circuit components. The stray capacitances C11–C32 are expressed along with corresponding nodes N11–N32 of the diode bridges DB1–DB3 and the transistors Q1–Q3. As described below, such stray capacitances inversely affect the performance of the driver circuit when the voltage to be generated is changed from one level to another.

In principle, one out of three voltage levels (V1, V2, V3) will be output through the buffer amplifier BUF by driving one diode bridge out of three diode bridges (DB1, DB2, DB3) to go ON. For example, when the control signal S1 is in a high level, the transistors Q1H and Q1L become active and which makes all the diodes in the diode bridge DB1 active. Therefore, the current from the current source $I_H$ flows through the transistor Q1H, the diode bridge DB1 and the transistor Q1L to the current source Q2L. Thus, the output of the diode bridge DB1 produces the voltage V1 which is provided at an buffer input NB and is output through the buffer amplifier BUF.

Similarly, when the control signal S2 is in a low level, the transistors Q2H and Q2L become active and thus diode bridge DB2 also becomes active and produces the voltage V2. Further, when the control signal S2 is in the high level and the control signal S1 is in the low level, the diode bridge DB3 becomes active and produces the terminal voltage V3.

FIG. 5 is a timing chart showing the operation of the driver circuit of FIG. 4 when the voltages V1 and V2 are repeatedly generated. In this example, the voltage V1 is higher than the voltage V2 and the voltage V2 is higher than the voltage V3 as shown in FIGS. 5A, 5B and 5C. In the first cycle, since the control signal S1 is high and the control signal S2 is low (FIGS. 5D and 5E), the diode bridge DB1 becomes ON and the selected voltage V1 is provided to the buffer input NB as shown in FIG. 5A. In the next cycle, the control signal S1 goes to the low level, and the control signal S2 remains in the low level. Thus, the diode bridge DB1 goes OFF and the diode bridge DB2 goes ON to provide the voltage V2 to the buffer input NB.

In the transition of the voltages as noted above, because of the stray capacitances exist at the nodes of the diode bridges, charge and discharge will occur in the capacitances which are dependent upon the changes in the electric potentials. It is not possible to completely remove the stray capacitances since the capacitances are formed by the physical structure of the circuit components.

For example, in the first cycle of FIG. 5 when the voltage V1 is selected, the node N11 of the diode bridge DB1 shows a voltage which is higher than the voltage V1 by a voltage drop (threshold voltage) Vd in the diodes $D_{11}$ and $D_{12}$. Thus, the voltage V1+Vd is charged in the stray capacitor C11. During the second cycle in which the voltage V2 is selected, the voltage of the node NB (buffer input) is lowered to V2, the charge in the stray capacitance C11 discharges through the diode $D_{12}$ in the diode bridge DB1 so as to balance with the voltage V2. This is because the diode $D_{12}$ is forward biased, which allows a small amount of current flowing therethrough. Therefore, in the transition from the first to second cycle, the voltage at the node N11 changes to the voltage V2 as shown in FIG. 5A.

With respect to the node N32, during the first cycle for generating the voltage V1, the stray capacitance C32 is charged to the voltage V1 through the diode bridge DB3 because the node NB is V1 and thus the diode $D_{34}$ is forward biased. In the second cycle, although the voltage at the node NB goes up to the voltage V2, the charge in the stray capacitance C32 is unchanged because the diode DB3 is now backward biased.

In the third cycle of FIG. 5, the control signal S1 goes high and the voltage V1 is produced again at the buffer input NB. In the transition of this voltage change, a portion of the current $I_H$ through the transistor Q1H flows into the stray capacitance C11 and the voltage at the node N11 gradually increases. Then the diode bridge DB1 is activated when the voltage at the stray capacitance C11 becomes higher than the voltage V1 by the diode threshold voltage Vd. The voltage change in this situation is expressed as:

$$dV/dt = I_H/C11.$$

Therefore, the voltage at the node NB changes from the voltage V1 to V2 by the voltage slope expressed by this equation.

Figure 5A:
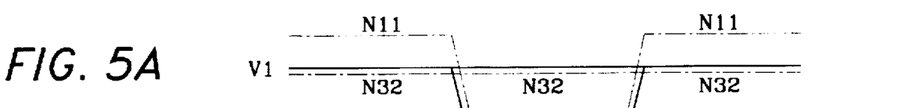
FIG. 5 is a timing chart showing an operation of the driver circuit of FIG. 4 when generating the test signals of two different voltage levels.
Figure 5B:
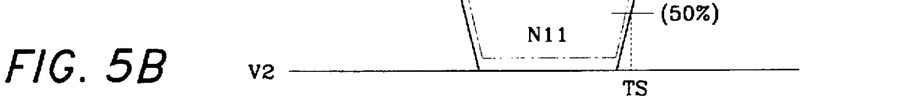
Figure 5C:
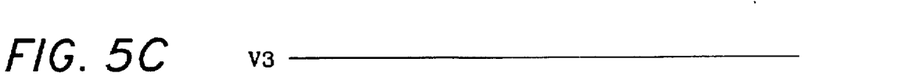
Figure 5D:
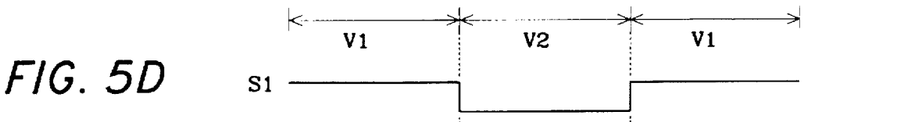
Figure 5E:
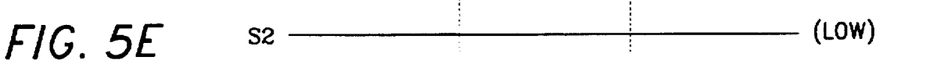

As in the foregoing, generally, because of the stray capacitances, a certain time is required for a diode bridge DBn to operate and output a voltage Vn at the buffer input NB. For example, as shown in FIG. 5A, such a delay time is expressed as a time $T_s$ which is a time required for the voltage reaches the 50% level of the voltage difference between V1 and V2.

FIG. 6 shows a situation where the voltage at the buffer input NB changes from V3 to V2 and to V1. As in the example of FIG. 5, the voltage V1 is higher than the voltage V2 and the voltage V2 is higher than the terminal voltage V3 as shown in FIGS. 6A–6C. In the first cycle, because the control signal S2 is high and the control signal S1 is low, the transistors Q3H and Q3L are turned to be active through the inverter 18 thereby the diode bridge DB3 becomes ON. As a result, the termination voltage V3 is applied to the buffer input NB.

In the next cycle, since the control signal S2 goes to a low level and the control signal S1 remains in the low level, the diode bridge DB3 goes OFF and the diode bridge DB2 goes ON. Thus, the selected voltage V2 is supplied to the buffer input NB.

During the first cycle where the termination voltage V3 is produced, the node N32 which is in the lower side of the diode bridge DB3 shows a voltage which is lower than the voltage V3 by the diode voltage drop (threshold voltage) Vd. This is because all of the diodes in the diode bridge DB3 are ON and the current from the current source $I_1$ flows through the transistors Q3H, the diode bridge DB3, the transistor Q3L to the current source $I_L$. Thus, the stray capacitance C32 at the node N32 is charged to the voltage level V3–Vd as shown in FIG. 6C.

Figure 6A:
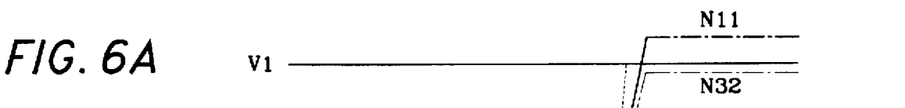
FIG. 6 is a timing chart showing an operation of the driver circuit of FIG. 4 when generating the test signals of three different voltage levels.
Figure 6B:
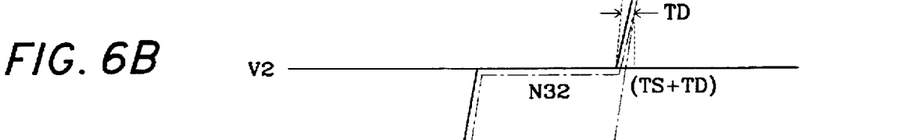

In the second cycle where the diode bridge DB2 is active and the voltage V2 is provided to the buffer input NB, the stray capacitance C32 is charged through the input NB, the diode $D_{34}$ in the diode bridge DB3 to the voltage V2 as shown in FIG. 6B. This is because a diode $D_{34}$ in the diode bridge DB3 is forward biased, although not sufficiently ON, and a small amount of current from the transistor Q2H flows through the diode $D_{34}$ to the stray capacitance C32.

Figure 6C:
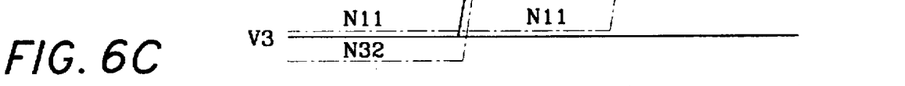
Figure 6D:
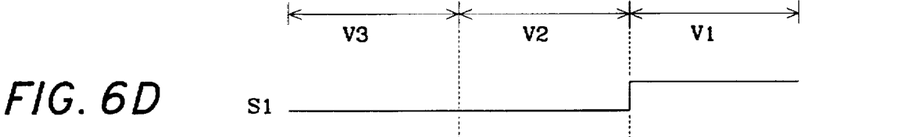
Figure 6E:
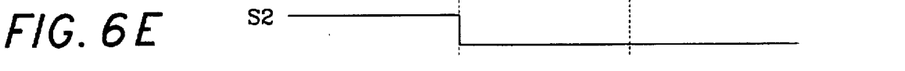

The potential of the node N11 is discharged to the voltage V3 in the first cycle as shown in FIG. 6C. This is because the buffer input NB is in the voltage V3 which is lower than a voltage across the stray capacitor C11 and thus the diode $D_{12}$ is forward biased to allow a small current flows from the capacitor C11 through the diodes $D_{12}$ and $D_{34}$ to the current source $I_L$. In the second cycle where the voltage V2 is provided to the buffer input NB from the diode bridge DB2, the voltage at the node N11 remains the voltage V3 as shown in FIG. 6B since the diode $D_{12}$ is backward biased because the voltage V2 is higher than the voltage V3.

In the third cycle where the control signal S1 goes to a high level and the diode bridge DB1 is activated, the buffer input NB is increased to the voltage V1 as shown in FIG. 6A. In this situation, the current from the current source $I_H$ flows through the transistor Q1H to the stray capacitance C11 so that the voltage at the node N11 gradually increases. Then the diode bridge DB1 is activated when the voltage becomes sufficiently high to drive the diode bridge DB1. This voltage change at the node N11 is expressed as follows:

$$dV/dt = I_H/C11.$$

Thus, the voltage at the node N11 increases with the slope determined by this relationship.

Although the rate of change in the voltage is the same as in the example of FIG. 5, the voltage difference is larger in this example of FIG. 6 than that of FIG. 5. Namely, the voltage in the stray capacitor C11 changes from V3 to V1 in FIG. 6 while the voltage change in FIG. 5 is from V2 to V1. Thus, the situation in FIG. 6 requires a longer delay time for the buffer input NB to reach the voltage V1.

Further, since the example of FIG. 6 requires the stray capacitance C32 at the node N32 to charge through the diode $D_{34}$ until reaching the voltage V1, it further causes a delay time for the node N32 in reaching the voltage V1. In contrast, as noted above, there is no voltage change at the node N32 in the example of FIG. 5, there is no time delay in the transition. Therefore, a time required for reaching the 50% of the voltage V1 in FIG. 6 is $T_S+T_D$, i.e., longer than the time of FIG. 5 by $T_D$.

As in the examples of FIGS. 5 and 6, voltages at the node N11 and N32 are affected by the output voltage of the previous cycles. Such voltage differences in the nodes cause the difference in the rise time $T_D$ of the voltages which are output by the driver circuit. Because the differences in the rise time $T_D$ is equivalent to a difference of skew (a timing difference between test signals between test channels), such differences in the rise time result in measurement errors or timing inaccuracy in testing semiconductor devices.

Although the problems associated in the driver circuit of FIG. 4 is described with reference to the specific voltage relationship, such problem is not limited to the above situation. For example, when the voltage V3 is higher than the voltages V1 or V2, the similar problem of rise time changes occur if the voltages are switched in the order of V3–V1–V2.

Figure 7:
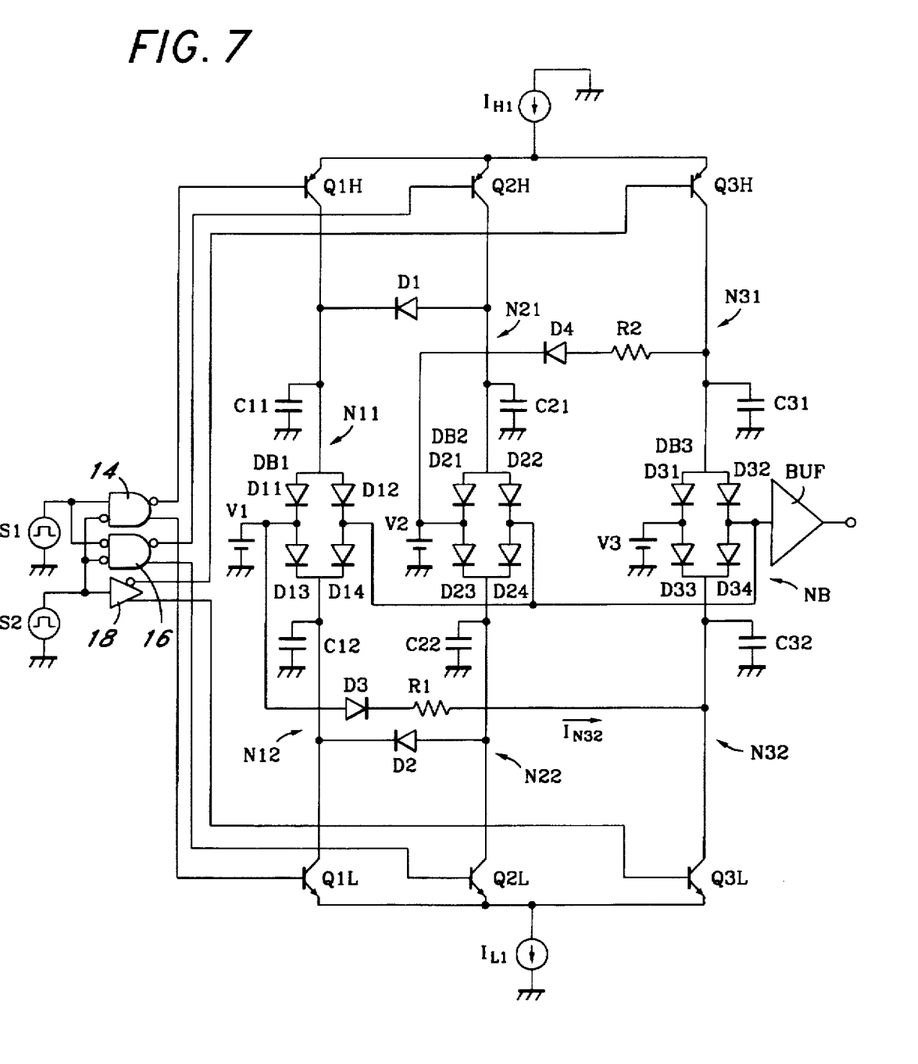
FIG. 7 is a circuit diagram showing another example of a driver circuit known and previously used by the assignee of the present invention for generating test signals of three voltage levels.

FIG. 7 shows another example of three level voltage driver circuit which is known to the same assignee of the present invention. The example of FIG. 7 tries to solve the disadvantages in the driver circuit of FIG. 4. A diode D1 is connected between the nodes N11 and N21, and a diode D2 is connected between the nodes N12 and N22. Also as shown FIG. 7, a series circuit of a diode D3 and a resistor R1 is connected between the voltage source V1 and the node N32. A series circuit of a diode D4 and a resistor R2 is connected between the voltage source V2 and the node N31.

Figure 8A:
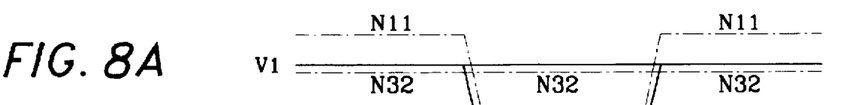
FIG. 8 is a timing chart showing an operation of the driver circuit of FIG. 7 when generating the test signals of two different voltage levels.
Figure 8B:
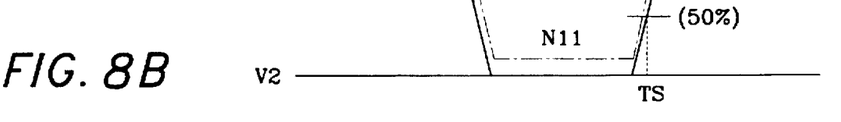
Figure 8C:
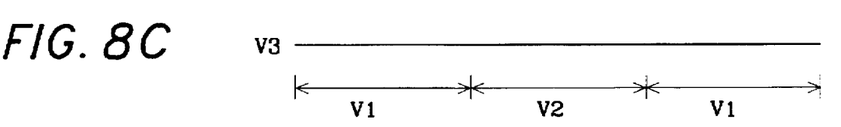
Figure 9A:
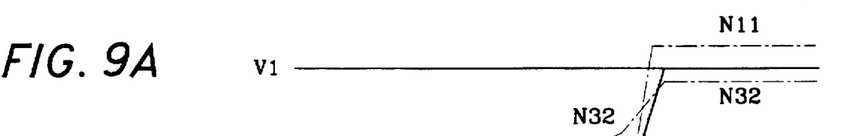
FIG. 9 is a timing chart showing an operation of the driver circuit of FIG. 7 when generating the test signals of three different voltage levels.
Figure 9B:
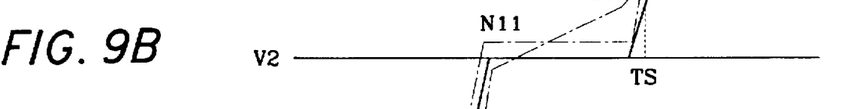
Figure 9C:
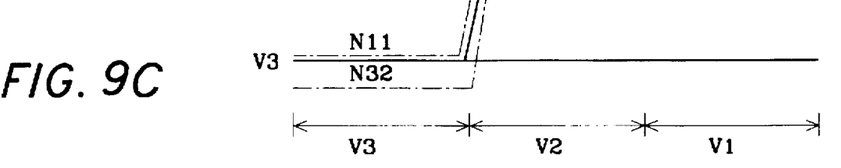

FIGS. 8 is a timing chart showing the operation of the driver circuit of FIG. 7 when the voltages V1 and V2 are repeatedly generated. FIGS. 9 is a timing chart showing the operation of the driver circuit of FIG. 7 when the voltages V1, V2 and V3 are generated. FIGS. 8 and 9 correspond to the timing charts of FIGS. 5 and 6 regarding the driver circuit of FIG. 4.

The timing chart of FIG. 8 is substantially the same as that of FIG. 5. In FIG. 9, when the voltage V1 is changed to the voltage V2 in the second cycle, the node N11 goes up to the voltage V2 because the stray capacitance C11 is charged through the diode D1. Thus, with respect to the transition from the voltage V2 to the voltage V1 in the third cycle, the conditions in FIG. 8 and 9 are substantially the same. In other words, there is no timing difference between the situations between FIGS. 8 and 9 unlike the situation in FIGS. 5 and 6.

With respect to the node N32, in the example of FIG. 8, the voltage at the node N32 remains unchanged in the transition from the voltage V2 to the voltage V1 as described with reference to FIG. 5. In the example of FIG. 9, when the voltage is changed from V3 to V2, the stray capacitor C32 is slowly charged toward the voltage V1 by current $I_{N32}$ flows from the voltage source V1 through the diode D3 and the resistor R1.

At the time of the transition from the voltage V2 to the voltage V1 in the third cycle, the voltage across the stray capacitor C32 has been charged to a voltage level close to the voltage V1. This is especially effective when a time constant formed by the resistor R1 and the stray capacitor C32 is sufficiently small to that the voltage level quickly reaches the voltage V1. Therefore, there is no substantial charge is involved for the capacitor C32 in this transition, which is a situation similar to the example of FIG. 8 unlike the situation in FIGS. 5 and 6.

As noted above, the driver circuit of FIG. 7 can improve the performance by minimizing the problems arise in the driver circuit of FIG. 4. However, in the driver circuit of FIG. 7, the current $I_{N32}$ flowing through the series circuit of the diode D3 and the resistor R1 tends to cause an unbalance in the diode bridge DB3. If there is such an unbalance in a diode bridge, an output voltage of the diode bridge, i.e., the voltage at the buffer input NB will not be accurately equal to the voltage supplied to the diode bridge.

An example of such an unbalance in the diode bridge is explained in the following. In a diode bridge, such as the bridge DB3, the current coming from the source $I_{H1}$ and the current going to the source $I_{L1}$ are designed to be equal so that all of the diodes $D_{31}$–$D_{34}$ in the bridge DB3 perform at the same current level. However, when the current $I_{N32}$ flows into the current source $I_{L1}$, the less current must flow in the diode $D_{33}$ and $D_{34}$ while the same current flows through the diode $D_{31}$. The excess current from the current source $I_{H1}$ flows into the voltage source V3. Therefore, there arises current unbalance in the diode bridge DB3, which causes a voltage error between the voltage at the buffer input NB and the voltage V3.

Figure 10:
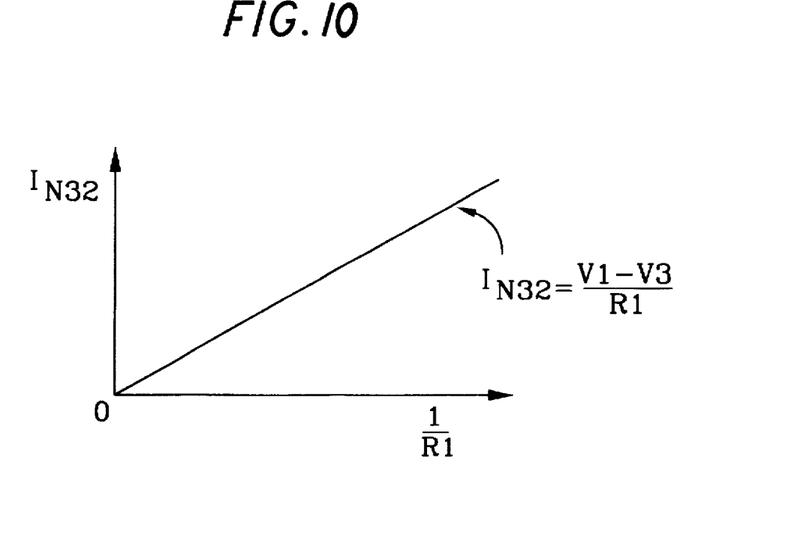
FIG. 10 is a graph showing unbalance current of a diode bridge as a parameter of resistance in a series circuit.

The voltage error is proportional to the current (unbalance current) flowing through the diode D3 and the resistor R1. FIG. 10 shows the amount of the unbalance current $I_{N32}$ which is inverse proportional to the value of the resistor R1. Although the timing error involved in the voltage shift from V2 to V3 can be reduced by decreasing the value of the resistor R1 as noted above, the reduction of resistance will increase the unbalance current and thus the voltage error. Further, the voltage error (the unbalance current $I_{N32}$ is dependent upon the voltage difference between V1 and V3. As noted above, the voltages V1, V2 and V3 must be variable to meet the various type of semiconductor devices to be tested. Therefore, it is not possible to compensated the error caused by the unbalance in the diode bridge.

SUMMARY OF THE INVENTION

It is, therefore, an object of the present invention to provide a driver circuit for a semiconductor test system for testing semiconductor devices which generates test signals having three voltage levels with improved timing and voltage level accuracy.

It is another object of the present invention to provide a driver circuit for a semiconductor test system which is capable of minimizing the timing errors and the voltage level errors caused by the rise time differences derived from the stray capacitances in the circuit.

The driver circuit of the present invention is to generate test signals having predetermined voltage levels through diode bridges, buffer amplifier, and further diode bridges for improving rise time of the test signals in view of the stray capacitances.

The driver circuit of the present invention includes: a buffer amplifier for supplying test signals having predetermined voltage levels; a first diode bridge connected to a first voltage source for providing a first voltage level to an input of the buffer amplifier where the first diode bridge has an upper node and an lower node for flowing bridge current therethrough; a second diode bridge connected to a second voltage source for providing a second voltage level to the buffer amplifier where the second diode bridge has an upper node and an lower node for flowing bridge current therethrough; a third diode bridge connected to a third voltage source for providing a third voltage level to the buffer amplifier where the third diode bridge has an upper node and an lower node for flowing bridge current therethrough; a fourth diode bridge connected between the first voltage source and the lower node of the third diode bridge; and a fifth diode bridge connected between the second voltage source and the upper node of the third diode bridge.

According to the present invention, the driver circuit for a semiconductor test system is able to generate test signals having three voltage levels with high timing and voltage level accuracy. The driver circuit of the present invention is capable of minimizing the timing errors and voltage level errors caused by rise time differences associated with stray capacitances in the circuit.

DETAILED DESCRIPTION OF THE PREFERRED EMBODIMENT

Figure 1:
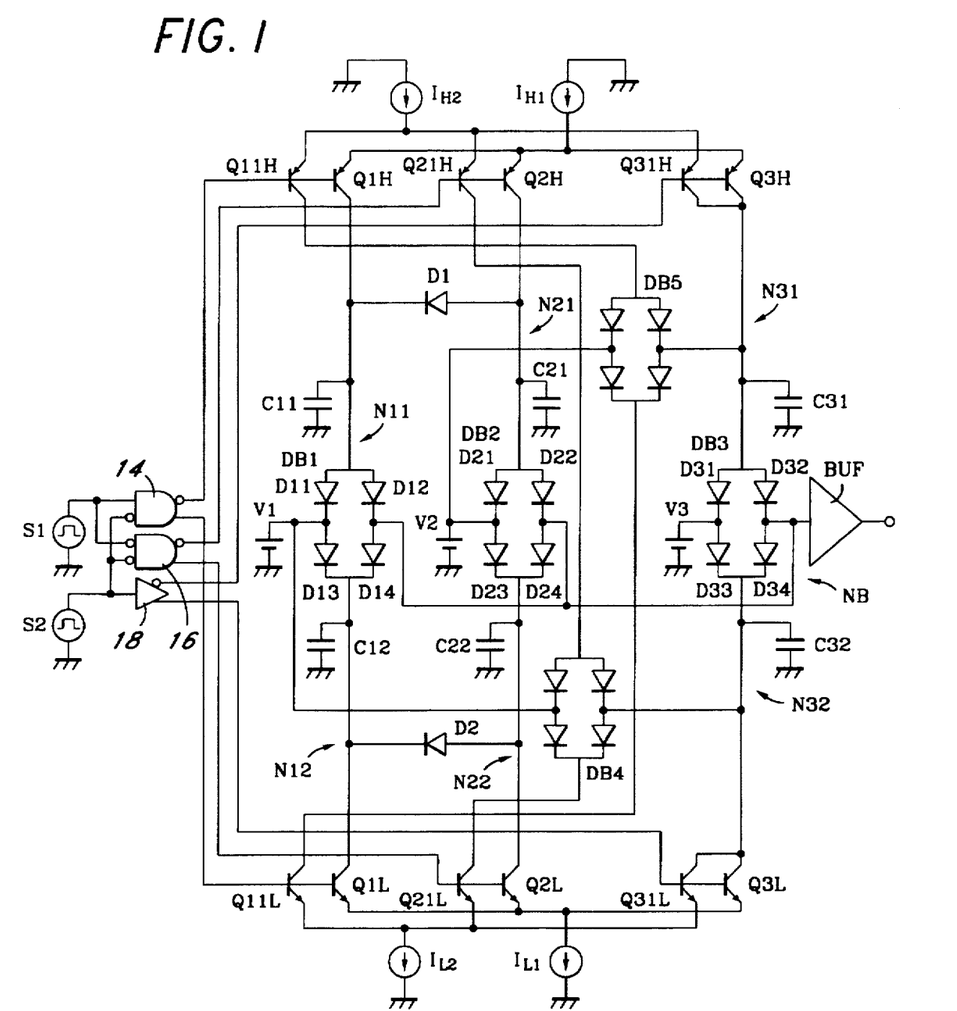
FIG. 1 is a circuit diagram showing an example of a driver circuit of the present invention.

FIG. 1 shows an example of a driver circuit of the present invention. In FIG. 1, the same circuit components are designated by the same reference labels used in FIGS. 4 and 7. Like the examples of FIGS. 4 and 7, the driver circuit of FIG. 1 is configured to output test signals with three voltage levels V1, V2 and V3 by having three diode bridges DB1, DB2 and DB3. For example, two voltage levels V1 and V2 are a logic high level and a logic low level, respectively. The third voltage level V3 is for terminating an output of the device through an output impedance (not shown) such as 50 ohm.

In FIG. 1, the diode bridge DB1 is connected between a transistor Q1H and a transistor Q1L. The diode bridge DB1 is provided with a high level voltage V1. The diode bridge DB2 is connected between a transistor Q2H and a transistor Q2L. The diode bridge DB2 is provided with a low level voltage V2. The diode bridge DB3 is connected between a transistor Q3H and a transistor Q3L. The diode bridge DB3 is provided with a terminal voltage V3. Each output of the diode bridges DB1, DB2 ad DB3 is connected to an input node NB of a buffer amplifier BUF.

A current source $I_H$ is connected to the transistors Q1H–Q3H and a current source $I_L$ is connected to the transistors Q1L–Q3L as shown in FIG. 1. Gates 14 and 16 and an inverter 18 are provided to drive the corresponding transistors Q1H–Q3L and thus the diode bridges DB1–DB3. Control signals S1 and S2 are provided to the gates 14, 16 and the inverter 18 to select either one of the voltages V1–V3 V3 by driving the corresponding pair of transistors and the diode bridge.

FIG. 1 also shows stray capacitances C11–C32 which are inherent capacitances exist between physical distances in the circuit components. The stray capacitances C11–C32 are expressed along with corresponding nodes N11–N32 of the diode bridges DB1–DB3 and the transistors Q1–Q3. As described above with reference to FIGS. 4–9, such stray capacitances inversely affect the performance of the driver circuit when the voltage to be generated is changed from one level to another.

In principle, one out of three voltage levels (V1, V2, V3) will be output through the buffer amplifier BUF by setting one diode bridge out of three diode bridges (DB1, DB2, DB3) to ON. For example, when the control signal S1 is in a high level, the transistors Q1H and Q1L become active and which makes all the diodes in the diode bridge DB1 active. Therefore, the current from the current source $I_H$ flows through the transistor Q1H, the diode bridge DB1 and the transistor Q1L to the current source $I_L$. Thus, the output of the diode bridge DB1 produces the voltage V1 which is provided at an buffer input NB and is output through the buffer amplifier BUF.

Similarly, when the control signal S2 is in a low level, the transistors Q2H and Q2L become active and thus diode bridge DB2 also becomes active and produces the voltage V2. Further, when the control signal S2 is in a high level and the control signal S1 is in the low level, the diode bridge DB3 becomes active and produces the terminal voltage V3.

The foregoing structure and basic operation are the same as the driver circuit of FIG. 4. The driver circuit of FIG. 1 additionally includes diode bridges DB4 and DB5, transistors Q11H, Q11L, Q21H, Q21L, Q31H and Q31L, diodes D1 and D2, and current sources $I_{H2}$ and $I_{L2}$. The current sources $I_{H2}$ and $I_{L2}$ provide enough current for driving the diode bridge DB4 or DB5. The diode D1 is connected between the nodes N11 and N21 where the stray capacitors C11 and C21 exist, respectively. The diode D2 is connected between the nodes N12 and N22 where the stray capacitors C12 and C22 exist, respectively.

The diode bridge DB4 is connected between the voltage source V1 and the node N32 where the stray capacitance C32 is shown. The diode bridge DB5 is connected between the voltage source V2 and the node N31 where the stray capacitance C31 is shown. The diode bridge DB4 is driven by the transistors Q21H and Q21L when the gate 16 is in active. The bases of the transistors Q21H and Q21L are respectively connected to the bases of the transistors Q2H and Q2L. Thus, the diode bridges DB4 and DB2 are driven in the same way at the same time by the control signals S1 and S2. The diode bridge DB5 is driven by the transistors Q11H and Q11L when the gate 14 is in active. The bases of the transistors Q11H and Q11L are respectively connected to the bases of the transistors Q1H and Q1L. Thus, the diode bridges DB5 and DB1 are driven in the same way at the same time by the control signals S1 and S2.

The bases of the transistors Q31H and Q31L are respectively connected to the bases of the transistors Q3H and Q31. Thus, the diode bridge DB3 is driven by the transistors Q3H, Q31H, Q3L and Q31L. Thus, in this example, the diode bridge DB3 is provided with current from the both the current sources $I_{H1}$ and $I_{H2}$ which flows into the current sources $I_{L1}$ and $I_{L2}$. This configuration is necessary to establish a current flow path for the current from the current sources $I_{H2}$ and $I_{L2}$ so that the current flows through the diode bridge DB3 when not either of the diode bridges DB4 or DB5 is in active.

Figure 2A:
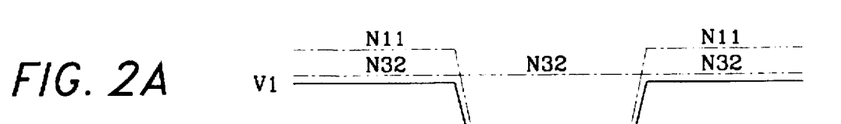
FIG. 2 is a timing chart showing an operation of the driver circuit of FIG. 1 when generating test signals of two different voltage levels.
Figure 2B:
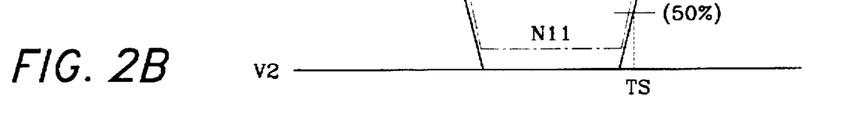
Figure 2C:
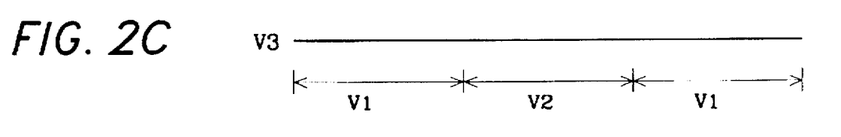
Figure 3A:
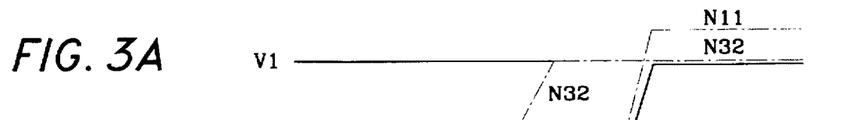
FIG. 3 is a timing chart showing an operation of the driver circuit of FIG. 1 when generating test signals of three different voltage levels.
Figure 3B:
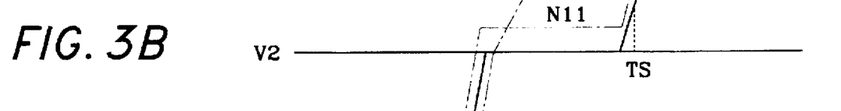
Figure 3C:
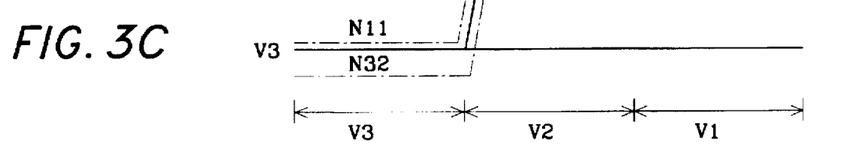

FIG. 2 is a timing chart showing an operation of the driver circuit of FIG. 1 when generating signals of two different voltage levels. FIG. 3 is a timing chart showing an operation of the driver circuit of FIG. 1 when generating signals of three different voltage levels. Like the example in FIGS. 5, 6 and 8 and 9, the voltage V1 is higher than the voltage V2 and the voltage V2 is higher than the voltage V3 as shown in FIGS. 2A–2C and 3A–3C, although the present invention is not limited to this voltage relationship.

The operation shown in FIG. 2 is almost the same as that of FIGS. 5 and 8 which show the voltage transitions between V1 and V2. In FIG. 3, for changing the three voltage levels, the diode bridges DB4 and DB5 perform the effects of the present invention as in the following. In the transition from the voltage V2 to the voltage V3, the stray capacitor C11 at the node N11 of the diode bridge DB1 is charged through the diode D1. Thus, the node N11 is balanced at the voltage V2 in the first cycle.

Also in this transition, since the diode bridge DB4 is ON, the stray capacitor C32 at the node N32 of the diode bridge DB3 is charged toward the voltage V1. Thus, as shown in the second cycle of FIG. 3, the node N32 quickly reaches the voltage V1. At the time of the next transition from the voltage V2 to the voltage V1, the voltages at the nodes are equivalent to that of the situation in FIG. 2. As a result, there is no timing difference between FIGS. 2 and 3 for this voltage transition.

During the period of generating the voltage V3, since the diode bridges DB4 and DB5 are OFF, and thus no current flows into the current path for the diode bridge DB3, i.e., to the node N32, the diode bridge DB3 is not affected its current balance. Therefore, the voltage provided at the buffer input NB is equal to the voltage V3 without involving any voltage errors.

In the foregoing example, the present invention has been explained with specific voltage situations such as voltage changes from V3, V2 to V1. However, the effect of the present invention is not limited to this specific voltage relationship. For example, as noted above with reference to FIGS. 4–6, the similar problems associated in the driver circuit of FIG. 4 is also found when the voltage V3 is higher than the voltages V1 or V2. In such a situation, the similar problem of rise time changes occur if the voltages are switched in the order of V3–V1–V2.

The problems associated with the voltage relationship in this situation is solved in the present invention by the diode bridge DB5 and the diode D2. Namely, the diode bridge DB5 and the diode D2 are effective in the present invention when the voltage V3 is higher than the voltage V1, and the voltage V1 is higher than the voltage V2, and further, the order of the voltage changes is V3–V1–V3. In this situation, the diode bridge promotes to discharge in the stray capacitor C31 at the node N31 toward the voltage V2, and the diode D2 promotes to charge for the stray capacitor C12 toward the voltage V2.

According to the present invention, the driver circuit for a semiconductor test system is able to generate test signals having three voltage levels with high timing and voltage level accuracy. The driver circuit of the present invention is capable of minimizing the timing errors and voltage level errors caused by rise time differences associated with stray capacitances in the circuit.

What is claimed is:

1. A driver circuit for a semiconductor test system for generating test signals having predetermined voltage levels for testing a semiconductor device, comprising:
   a buffer amplifier for supplying test signals having predetermined voltage levels;
   a first diode bridge connected to a first voltage source for providing a first voltage level to an input of said buffer amplifier, said first diode bridge having an upper node and an lower node for flowing bridge current therethrough;
   a second diode bridge connected to a second voltage source for providing a second voltage level to said input of said buffer amplifier, said second diode bridge having an upper node and an lower node for flowing bridge current therethrough;
   a third diode bridge connected to a third voltage source for providing a third voltage level to said input of said buffer amplifier, said third diode bridge having an upper node and an lower node for flowing bridge current therethrough;
   a fourth diode bridge connected between said first voltage source and said lower node of said third diode bridge; and
   a fifth diode bridge connected between said second voltage source and said upper node of said third diode bridge.

2. A driver circuit as defined in claim 1, further comprising:
   a first diode connected between said upper node of said first diode bridge and said upper node of said second diode bridge; and
   a second diode connected between said lower node of said first diode bridge and said lower node of said second diode bridge.

3. A driver circuit as defined in claim 2, further comprising:
   a first pair of transistors for supplying said bridge current to said first diode bridge;
   a second pair of transistors for supplying said bridge current to said second diode bridge; and
   a third pair of transistors for supplying said bridge current to said third diode bridge.

4. A driver circuit as defined in claim 3, further comprising:
   a fourth pair of transistors for supplying bridge current to said fourth diode bridge; and
   a fifth pair of transistors for supplying bridge current to said fifth diode bridge.

5. A driver circuit as defined in claim 4, further comprising:
   a gate circuit which drives said transistors based on control signals;
   a first pair of current sources for providing first bridge current to one of said first, second or third diode bridge through a corresponding pair of said transistors; and
   a second pair of current sources for providing second bridge current to one of said fourth or fifth diode bridge through a corresponding pair of said transistors.

6. A driver circuit as defined in claim 1, wherein said first diode bridge and said fifth diode bridge are driven at the same time, and said second diode bridge and said fourth diode bridge are driven at the same time.

7. A driver circuit as defined in claim 1, wherein said first voltage level is higher than said second voltage level, and said second voltage level is higher than said third voltage level.

8. A driver circuit as defined in claim 1, wherein said first voltage level is higher than said second voltage level, and said third voltage level is higher than said first voltage level.

9. A driver circuit as defined in claim 5, further comprising:

a sixth pair of transistors for supplying said second bridge current to said third diode bridge;

wherein said third pair of transistors and said sixth pair of transistors are driven at the same time to provide said first and second bridge current to said third diode bridge.

10. A driver circuit as defined in claim 5, wherein said control signals are test pattern signals generated by said semiconductor test system to be provided with one of said first, second or third voltage levels and to be applied to corresponding pins of said semiconductor device.

11. A driver circuit for a semiconductor test system for generating test signals having predetermined voltage levels for testing a semiconductor device, comprising:

a buffer amplifier for supplying test signals having predetermined voltage levels;

a first diode bridge connected to a first voltage source for providing a first voltage level to an input of said buffer amplifier, said first diode bridge having an upper node and an lower node for flowing bridge current therethrough;

a second diode bridge connected to a second voltage source for providing a second voltage level to said input of said buffer amplifier, said second diode bridge having an upper node and an lower node for flowing bridge current therethrough;

a third diode bridge connected to a third voltage source for providing a third voltage level to said input of said buffer amplifier, said third diode bridge having an upper node and an lower node for flowing bridge current therethrough;

a fourth diode bridge connected between said first voltage source and said lower node of said third diode bridge;

a fifth diode bridge connected between said second voltage source and said upper node of said third diode bridge;

a first diode connected between said upper node of said first diode bridge and said upper node of said second diode bridge; and a second diode connected between said lower node of said first diode bridge and said lower node of said second diode bridge;

wherein said first diode bridge and said fifth diode bridge are driven at the same time, and said second diode bridge and said fourth diode bridge are driven at the same time.

* * * * *